(12) United States Patent
Du et al.

(10) Patent No.: US 11,448,683 B2
(45) Date of Patent: Sep. 20, 2022

(54) INSULATION DETECTION CIRCUIT, DETECTION METHOD AND BATTERY MANAGEMENT SYSTEM

(71) Applicant: Contemporary Amperex Technology Co., Limited, Ningde (CN)

(72) Inventors: Baohai Du, Ningde (CN); Le Chu, Ningde (CN); Jiayu Yu, Ningde (CN); Qiandeng Li, Ningde (CN)

(73) Assignee: Contemporary Amperex Technology Co., Limited, Ningde (CN)

(*) Notice: Subject to any disclaimer, the term of this patent is extended or adjusted under 35 U.S.C. 154(b) by 63 days.

(21) Appl. No.: 17/051,447

(22) PCT Filed: Jan. 15, 2020

(86) PCT No.: PCT/CN2020/072253
§ 371 (c)(1),
(2) Date: Oct. 29, 2020

(87) PCT Pub. No.: WO2020/147749
PCT Pub. Date: Jul. 23, 2020

(65) Prior Publication Data
US 2021/0231726 A1 Jul. 29, 2021

(30) Foreign Application Priority Data
Jan. 15, 2019 (CN) .......................... 201910035211.1

(51) Int. Cl.
*G01R 31/00* (2006.01)
*G01R 31/14* (2006.01)
(Continued)

(52) U.S. Cl.
CPC .......... *G01R 31/14* (2013.01); *G01R 27/025* (2013.01); *G01R 31/3648* (2013.01);
(Continued)

(58) Field of Classification Search
USPC .................................................. 324/551, 557
See application file for complete search history.

(56) References Cited

U.S. PATENT DOCUMENTS 10,969,419 B2 * 4/2021 Du .......................... G01R 31/52

FOREIGN PATENT DOCUMENTS

| CN | 103487660 A | 1/2014 |
|----|-------------|--------|
| CN | 103688183 A | 3/2014 |

(Continued)

OTHER PUBLICATIONS

The First Office Action for Chinese Application No. 201910035211.1, dated Aug. 7, 2020, 23 pages.
(Continued)

*Primary Examiner* — Vincent Q Nguyen
(74) *Attorney, Agent, or Firm* — East IP P.C.

(57) ABSTRACT

A circuit includes: an isolation power module, a first and second sampling modules, a first and second sampling points, a processor. A first terminal of the first sampling module is connected to a positive electrode of a battery pack and first terminal of a positive switch module, a second terminal of the first sampling module is connected to a negative electrode of the battery pack and a first terminal of the negative switch module, a third terminal of the first sampling module is connected to a first reference voltage end; a first terminal of the second sampling module is connected to a second terminal of the positive switch module and a positive electrode of the isolation power module, a second terminal of the second sampling module is connected to a second terminal of the negative switch module and a negative electrode of the isolation power module.

19 Claims, 6 Drawing Sheets

(51) Int. Cl.
  *G01R 31/389* (2019.01)
  *G01R 31/396* (2019.01)
  *G01R 31/3842* (2019.01)
  *G01R 27/02* (2006.01)
  *G01R 31/36* (2020.01)
  *H01M 10/42* (2006.01)
  *H01M 10/48* (2006.01)

(52) U.S. Cl.
  CPC ....... *G01R 31/389* (2019.01); *G01R 31/3842* (2019.01); *G01R 31/396* (2019.01); *H01M 10/425* (2013.01); *H01M 10/482* (2013.01); *H01M 2010/4271* (2013.01); *H01M 2010/4278* (2013.01)

(56) References Cited

FOREIGN PATENT DOCUMENTS

| | | |
|---|---|---|
| CN | 104220886 A | 12/2014 |
| CN | 103048545 B | 4/2016 |
| CN | 105717404 A | 6/2016 |
| CN | 206479582 U | 9/2017 |
| CN | 107526041 A | 12/2017 |
| CN | 207164146 U | 3/2018 |
| CN | 207473060 U | 6/2018 |
| CN | 108680793 A | 10/2018 |
| CN | 109765495 A | 5/2019 |
| EP | 1533882 A2 | 5/2005 |
| EP | 2720056 A1 | 4/2014 |
| JP | 2004104923 A | 4/2004 |
| KR | 20140041213 A | 4/2014 |
| KR | 101473396 B1 | 12/2014 |
| WO | 2015033627 A1 | 3/2015 |
| WO | 2019004544 A1 | 1/2019 |

OTHER PUBLICATIONS

The International Search Report for PCT Application No. PCT/CN2020/072253, dated Mar. 26, 2020, 14 pages.

The extended European search report for European Application No. 20741754.4, dated Jul. 21, 2021, 10 pages.

\* cited by examiner

Obtaining a first sampled signal from the first sampling point S1, and obtaining, according to the first sampled signal, an insulation resistance value Rip of a positive high voltage circuit at a side of where the battery pack to be detected is located relative to the first reference voltage end GND1 and an insulation resistance value Rin of a negative high voltage circuit at the side where the battery pack to be detected is located relative to the first reference voltage end GND1 ⟿ 701

Obtaining a second sampled signal from the second sampling point S2, and obtaining, according to the second sampled signal, an insulation resistance value Rep of a positive high voltage circuit at a side where the load is located relative to the second reference voltage end and an insulation resistance value Ren of a negative high voltage circuit at the side where the load is located relative to the second reference voltage end ⟿ 702

Fig. 7

INSULATION DETECTION CIRCUIT, DETECTION METHOD AND BATTERY MANAGEMENT SYSTEM

CROSS-REFERENCE TO RELATED APPLICATIONS

The present application claims priority to Chinese patent application No. 201910035211.1, entitled "INSULATION DETECTION CIRCUIT, DETECTION METHOD AND BATTERY MANAGEMENT SYSTEM", filed on Jan. 15, 2019, the entire contents of which are incorporated herein by reference.

TECHNICAL FIELD

The present application relates to the field of battery technology, in particular, to an insulation detection circuit, a detection method and a battery management system.

BACKGROUND

A battery pack is used for providing electric energy for an electric motor of an electric vehicle. The battery pack is connected to a load through a positive switch module and a negative switch module respectively. As it can be seen from the equation P=UI, it is necessary to use a scheme with a high voltage or a high current, in order to achieve a large power output. When the scheme with a high voltage is adopted, as the insulation material ages or is damaged, it is likely that the high voltage directly will be introduced into a passenger compartment, which causes a dangerous situation. When the scheme with a high-current is adopted, the line loss on the high-voltage circuit is relatively large, and the circuit temperature rise rate is high, which will reduce the insulation performance of the material, so it is important to detect and issue early warning of insulation abnormalities in advance.

Currently, the insulation detection is performed on the battery pack mainly based on an alternating current injection method or a voltage division method. The alternating current injection method or the voltage division method can detect the insulation resistance at the side where the battery pack is located before the positive switch module and the negative switch module are turned on, or, the insulation resistance at the side where the load is located after the positive switch module and the negative switch module are turned on. However, the alternating current injection method or the voltage division method cannot detect the insulation resistance at the side where the load is located when the positive switch module and the negative switch module are not turned on, and upon the positive switch module and the negative switch module being turned on, if there is a problem with the insulation resistance at the side where the load is located, a damage will occur to a controller. More severely, if there is insulation fault between the positive electrode or the negative electrode at the side where the load is located with the reference ground, it will directly lead to a short circuit of the battery pack, which affects the safe operation of the electric vehicle.

SUMMARY

The purpose of the present application is to provide an insulation detection circuit and a detection method, a battery management system, according to which the insulation resistance at the side where the load is located can be detected when the positive switch module and the negative switch module are not closed.

In a first aspect, the embodiments of the present application provide an insulation detection circuit, including: an isolation power module, a first sampling module, a first sampling point, a second sampling module, a second sampling point and a processor, where, a first terminal of the first sampling module is connected to a positive electrode of a battery pack to be detected and a first terminal of a positive switch module respectively, a second terminal of the first sampling module is connected to a negative electrode of the battery pack to be detected and a first terminal of a negative switch module respectively, a third terminal of the first sampling module is connected to a first reference voltage end, and the first sampling module is configured to provide a first sampled signal for the first sampling point;

a first terminal of the second sampling module is connected to a second terminal of the positive switch module and a positive electrode of the isolation power module respectively, a second terminal of the second sampling module is connected to a second terminal of the negative switch module and a negative electrode of the isolation power module respectively, a third terminal of the second sampling module is connected to a second reference voltage end, and the second sampling module is configured to provide a second sampled signal for the second sampling point; and the processor is connected to the first sampling point and the second sampling point respectively, the processor is configured to obtain, according to the first sampled signal, an insulation resistance value of a positive high voltage circuit at a side where the battery pack to be detected is located relative to the first reference voltage end and an insulation resistance value of a negative high voltage circuit at the side where the battery pack to be detected is located relative to the first reference voltage end, and obtain, according to the second sampled signal, an insulation resistance value of a positive high voltage circuit at a side where a load is located relative to the second reference voltage end and an insulation resistance value of a negative high voltage circuit at the side where the load is located relative to the second reference voltage end.

According to an implementation of the first aspect of the present application, the first sampling module includes a first positive voltage dividing unit, a first negative voltage dividing unit, a first pull-up unit, and a first protection unit, where, a first terminal of the first positive voltage dividing unit is connected to the positive electrode of the battery pack to be detected and the first terminal of the positive switch module respectively, and a second terminal of the first positive voltage dividing unit is connected to the first sampling point; a first terminal of the first negative voltage dividing unit is connected to the first sampling point, a second terminal of the first negative voltage dividing unit is connected to the negative electrode of the battery pack to be detected and the first terminal of the negative switch module respectively; the first pull-up unit is connected to the first sampling point; a first terminal of the first protection unit is connected to the first sampling point, and a second terminal of the first protection unit is connected to the first reference voltage end.

According to any one of the preceding implementations of the first aspect of the present application, the first positive voltage dividing unit includes a first resistor network and a first switch connected in series; the first negative voltage dividing unit includes a second resistor network and a second switch connected in series; the first pull-up unit includes a first pull-up power and a third resistor network connected in series, where, the third resistor network is connected to the first sampling point; the first protection unit includes a fourth resistor network.

According to any one of the preceding implementations of the first aspect of the present application, the first positive voltage dividing unit further includes a tenth resistor network, where, the tenth resistor network, the first resistor network and the first switch are connected in series; the first negative voltage dividing unit further includes an eleventh resistor network, where, the eleventh resistor network, the second resistor network and the second switch are connected in series.

According to any one of the preceding implementations of the first aspect of the present application, the second sampling module includes a second positive voltage dividing unit, a second negative voltage dividing unit, a second pull-up unit, and a second protection unit, where, a first terminal of the second positive voltage dividing unit is connected to the second of the positive switch module and the positive electrode of the isolation power module respectively, and a second terminal of the second positive voltage dividing unit is connected to the second sampling point; a first terminal of the second negative voltage dividing unit is connected to the second sampling point, and a second terminal of the second negative voltage dividing unit is connected to the second terminal of the negative switch module and the negative electrode of the isolation power module respectively; the second pull-up unit is connected to the second sampling point; a first terminal of the second protection unit is connected to the second sampling point, a second terminal of the second protection unit is connected to the second reference voltage end.

According to any one of the preceding implementations of the first aspect of the present application, the second positive voltage dividing unit includes a fifth resistor network and a third switch connected in series; the second negative voltage dividing unit includes a sixth resistor network and a fourth switch connected in series; the second pull-up unit includes a second pull-up power and a seventh resistor network connected in series, where, the seventh resistor network is connected to the second sampling point; the first protection unit includes an eighth resistor network.

According to any one of the preceding implementations of the first aspect of the present application, the second positive voltage dividing unit includes a twelfth resistor network, where, the twelfth resistor network, the fifth resistor network and the third switch are connected in series; the second negative voltage dividing unit includes a thirteenth resistor network, where, the thirteenth resistor network, the sixth resistor network and the fourth switch are connected in series.

According to any one of the preceding implementations of the first aspect of the present application, the insulation detection circuit further includes: a first analog-to-digital conversion unit and a second analog-to-digital conversion unit, where, two terminals of the first analog-to-digital conversion unit are connected to the first sampling point and the processor respectively, two terminals of the second analog-to-digital conversion unit are connected to the second sampling point and the processor respectively.

According to any one of the preceding implementations of the first aspect of the present application, the insulation detection circuit further includes a first filtering module and a second filtering module, where, a first terminal of the first filtering module is connected to the first sampling point, a second terminal of the first filtering module is connected to the processor, and the first filtering module is configured to filter the first sampled signal; a first terminal of the second filtering module is connected to the second sampling point, a second terminal of the second filtering module is connected to the processor, and the second filtering module is configured to filter the second sampled signal.

According to any one of the preceding implementations of the first aspect of the present application, the isolation power module includes an insulation power driving unit and a transformer connected to each other; the isolation power driving unit is powered by a direct current voltage source or a battery pack; and the isolation power driving unit and the transformer are configured to process an output voltage of the direct current voltage source or the battery pack to supply power to the positive electrode and the negative electrode of the isolation power module.

According to any one of the preceding implementations of the first aspect of the present application, a coil of the transformer includes two terminals, which are a first terminal and a second terminal respectively, where: a first terminal of a coil located on a first side of the transformer is connected to a first output terminal of the isolation power driving unit, a second terminal of the coil located on the first side of the transformer is connected to a second output terminal of the isolation power driving unit; a first terminal of a coil located on a second side of the transformer is configured to supply power to the positive electrode of the isolation power module, and a second terminal of the coil located on the second side of the transformer is configured to supply power to the negative electrode of the isolation power module.

According to any one of the preceding implementations of the first aspect of the present application, a coil of the transformer includes three terminals, which are a first terminal and a second terminal and a third terminal respectively, where: a first terminal of a coil located on a first side of the transformer is connected to a first output terminal of the isolation power driving unit, a second terminal of the coil located on the first side of the transformer is connected to a third reference voltage end, and a third terminal of the coil located on the first side of the transformer is connected to a second output terminal of the isolation power driving unit; a first terminal of a coil located on a second side of the transformer is configured to supply power to the positive electrode of the isolation power module, a second terminal of the coil located on the second side of the transformer is configured to supply power to the negative electrode of the isolation power module, and a third terminal of the coil located on the second side of the transformer is configured to connect to the first terminal of the coil located on the second side of the transformer.

According to any one of the preceding implementations of the first aspect of the present application, the isolation power module further includes a ninth resistor network, where, the ninth resistor network is located on a line between the coil on the second side of the transformer and the positive electrode or the negative electrode of the isolation power module.

According to any one of the preceding implementations of the first aspect of the present application, the isolation power module further includes a first isolation transmission unit; a first terminal of the first isolation transmission unit is connected to a first terminal or a second terminal of the ninth resistor network, and a second terminal of the first isolation transmission unit is connected to a first input terminal of the isolation power driving unit.

According to any one of the preceding implementations of the first aspect of the present application, the isolation power module includes a current sampling unit, a second isolation transmission unit and a microprocessing unit electrically connected in sequence; the current sampling unit includes a first sampling terminal and a second sampling terminal, where, the first sampling terminal is connected to a first terminal of the ninth resistor network, the second sampling terminal is connected to a second terminal of the ninth resistor network, and the microprocessing unit is further connected to a second input terminal of the isolation power driving unit.

In a second aspect, embodiments of the present application provide a battery management system, including the insulation detection circuit as described above.

In a third aspect, embodiments of the present application provide a detection method of an insulation detection circuit, which is applied to the insulation detection circuit as described above, where, the method includes: obtaining a first sampled signal from the first sampling point, and obtaining, according to the first sampled signal, an insulation resistance value of a positive high voltage circuit at a side where the battery pack to be detected is located relative to the first reference voltage end and an insulation resistance value of a negative high voltage circuit at the side where the battery pack to be detected is located relative to the first reference voltage end; and obtaining a second sampled signal from the second sampling point, and obtaining, according to the second sampled signal, an insulation resistance value of a positive high voltage circuit at a side where a load is located relative to the second reference voltage end and an insulation resistance value of a negative high voltage circuit at the side where the load is located relative to the second reference voltage end.

According to an implementation of the third aspect of the present application, the obtaining a first sampled signal from the first sampling point, and obtaining, according to the first sampled signal, an insulation resistance value of a positive high voltage circuit at a side where the battery pack to be detected is located relative to the first reference voltage end and an insulation resistance value of a negative high voltage circuit at the side where the battery pack to be detected is located relative to the first reference voltage end includes: turning on the first switch, and turning off the second switch, to obtain a first positive sampled signal from the first sampling point; turning off the first switch, and turning on the second switch, to obtain a first negative sampled signal from the first sampling point; obtaining, according to the first positive sampled signal and the first negative sampled signal, the insulation resistance value of the positive high voltage circuit at the side where the battery pack to be detected is located relative to the first reference voltage end and the insulation resistance value of the negative high voltage circuit at the side where the battery pack to be detected is located relative to the first reference voltage end.

According to any one of the preceding implementations of the third aspect of the present application, the obtaining a second sampled signal from the second sampling point, and obtaining, according to the second sampled signal, an insulation resistance value of a positive high voltage circuit at a side where a load is located relative to the second reference voltage end and an insulation resistance value of a negative high voltage circuit at the side where the load is located relative to the second reference voltage end includes: turning on the third switch, and turning off the fourth switch, to obtain a second positive sampled signal from the second sampling point; turning off the third switch, and turning on the fourth switch, to obtain a second negative sampled signal from the second sampling point; obtaining, according to the second positive sampled signal and the second negative sampled signal, the insulation resistance value of the positive high voltage circuit at the side where the load is located relative to the second reference voltage end and the insulation resistance value of the negative high voltage circuit at the side where the load is located relative to the second reference voltage end.

According to any one of the preceding implementations of the third aspect of the present application, the method further includes: at a first predetermined moment, collecting a first set of voltage signals from the first terminal and the second terminal of the ninth resistor network, and obtaining, based on the first set of voltage signals, a charging current of the isolation power module at the first predetermined moment; at a second predetermined moment, collecting a second set of voltage signals from the first terminal and the second terminal of the ninth resistor network, and obtaining, based on the second set of voltage signals, a charging current of the isolation power module at the second predetermined moment, where, the first predetermined moment is earlier than the second predetermined moment; comparing the charging current at the first predetermined moment and the charging current at the second predetermined moment; determining, according to a result of the comparing, whether a load electric circuit of the battery pack to be detected is short circuited; if the load electric circuit fails, turning off the isolation power driving unit, disabling the positive switch module and the negative switch module, and reporting information indicating that the load electric circuit fails to a higher-level controller.

According to the embodiments of the present application, the first terminal of the second sampling module is connected to the second terminal of the positive switch module and the positive electrode of the isolation power module respectively, and the second terminal of the second sampling module is connected to the second terminal of the negative switch module and the negative electrode of the isolation power module respectively. That is to say, the isolation power module, the second sampling module, the insulation resistance value of the positive high voltage circuit at the side where the load is located relative to the second reference voltage end and the insulation resistance value of the negative high voltage circuit at the side where the load is located relative to the second reference voltage end can form a circuit. The isolation power module can also form a circuit with the equivalent impedor of the load appliance, that is, the isolation power module can supply power to the second sampling module, the positive insulation impedor at the side where the load is located, the negative insulation impedor at the side where the load is located and the load appliance.

Compared with the situation where the battery pack to be detected can supply power to the second sampling module, the positive insulation impedor at the side where the load is located, the negative insulation impedor at the side where the load is located and the load appliance only when the positive switching module and the negative switching module are both turned on, the isolation power module can supply power to the second sampling module, the positive insulation impedor at the side where the load is located, the negative insulation impedor at the side where the load is located and the load appliance as a substitute for the battery pack to be detected, so that the insulation detection circuit can measure the insulation impedance value at the side where the load of the battery pack to be detected is located when both the positive switch module and the negative switch module are not turned on.

BRIEF DESCRIPTION OF THE DRAWINGS

The features, advantages and technical effects of the exemplary embodiments of the present application will be described below with reference to the accompanying drawings, which are not drawn to the actual scale.

FIG. 7 is a schematic flowchart of a detection method of an insulation detection circuit according to an embodiment of the present application;

DESCRIPTION OF EXAMPLE CONFIGURATIONS

The features and exemplary embodiments of various aspects of the present application will be described in detail below. In the following detailed description, numerous specific details are set forth in order to provide a thorough understanding of the present application.

The present application provides an insulation detection circuit, a detection method, and a battery management system. The insulation detection circuit can detect the insulation resistance at the side where the load is located when the high-voltage circuit switch is not turned on.

The battery pack to be detected may be a lithium ion battery, a lithium metal battery, a lead-acid battery, a nickel-cadmium battery, a nickel hydrogen battery, a lithium sulfur battery, a lithium air battery, or a sodium ion battery, which will not be limited herein. In terms of scale, the power battery to be tested may also be a battery cell, or a battery module or a battery pack, which is not limited herein.

Figure 1:
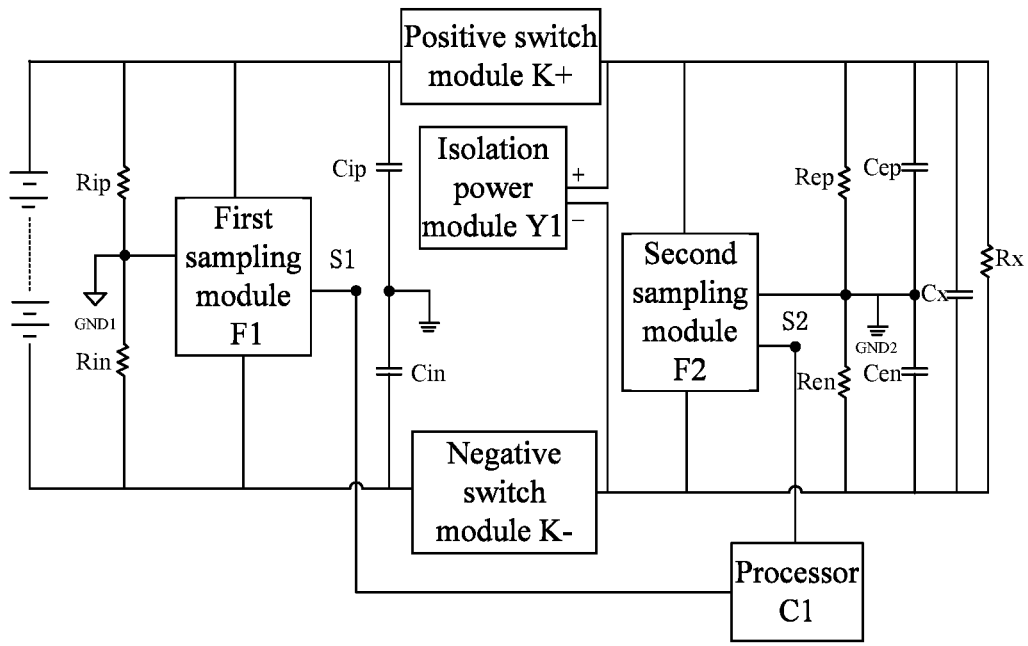
FIG. 1 is a structural diagram of an insulation detection circuit according to an embodiment of the present application.

FIG. 1 is a structural diagram of an insulation detection circuit according to an embodiment of the present application. As shown in FIG. 1, the insulation detection circuit includes: an isolation power module Y1, a first sampling module F1, a first sampling point S1, a second sampling module F2, a second sampling point S2 and a processor C1.

A first terminal of the first sampling module F1 is connected to a positive electrode of the battery pack to be detected and a first terminal of a positive switch module K+ respectively, a second terminal of the first sampling module F1 is connected to a negative electrode of the battery pack to be detected and a first terminal of a negative switch module K-respectively, a third terminal of the first sampling module F1 is connected to a first reference voltage end GND1, and the first sampling module is configured to provide a first sampled signal for the first sampling point S1.

A first terminal of the second sampling module F2 is connected to a second terminal of the positive switch module K+ and a positive electrode of the isolation power module Y1 respectively, a second terminal of the second sampling module F2 is connected to a second terminal of the negative switch module K- and a negative electrode of the isolation power module Y1 respectively, a third terminal of the second sampling module F2 is connected to a second reference voltage end GND2, and the second sampling module F2 is configured to provide a second sampled signal for the second sampling point S2.

The processor C1 is connected to the first sampling point S1 and the second sampling point S2 respectively, the processor C1 is configured to obtain, according to the first sampled signal, an insulation resistance value Rip of a positive high voltage circuit at a side where the battery pack to be detected is located relative to the first reference voltage end GND1 and an insulation resistance value Rin of a negative high voltage circuit at the side where the battery pack to be detected is located relative to the first reference voltage end, and obtain, according to the second sampled signal, an insulation resistance value Rep of a positive high voltage circuit at a side where the load is located relative to the second reference voltage end GND2 and an insulation resistance value Ren of a negative high voltage circuit at the side where the load is located relative to the second reference voltage end GND2.

The positive switch module K+ and the negative switch module K- are switches located between the battery pack to be detected and load electric circuit, such as relays, optocouplers, insulated gate bipolar transistors (IGBTs), and the like.

The actual voltages of the first reference voltage end GND1 and the second reference voltage end GND2 may be set according to the operation scenario and requirements of the insulation detection circuit. The actual voltages of the first reference voltage end GND1 and the second reference voltage end GND2 may be the same or different, which will not be limited herein. In an example, the first reference voltage end GND1 may be a casing of a battery pack, and the second reference voltage end GND2 may be a vehicle body.

The processor C1 may be a processing device dedicated to the insulation detection circuit, or may be a processing device shared with other circuits. The insulation detection circuit may be an independent circuit structure or a part of the overall circuit structure. The on/off state of the positive switch module K+ and the negative switch module K- may be controlled by the processor C1 or other control device, which will not be limited herein.

For example, the insulation detection circuit according to the embodiment of the present application may be integrated into the battery management system, and a part of the overall circuit structure of the battery management system is used for insulation detection of the battery pack.

FIG. 1 further shows Cip, Cin, Cep, Cen and Cx, where Cip and Cin are the equivalent capacitors between the positive electrode and the negative electrode of the battery pack to be detected with its casing, Cep and Cen are the equivalent capacitors between the positive electrode and the negative electrode of the battery pack to be detected with the vehicle body, and Cx is the X capacitor.

In the embodiment of the present application, the first terminal of the second sampling module F2 is connected to the second terminal of the positive switch module K+ and the positive electrode of the isolation power module Y1 respectively, and a second terminal of the second sampling module F2 is connected to the second terminal of the negative switch module K− and the negative electrode of the isolation power module Y1 respectively. In other words, the isolation power module Y1, the second sampling module F2, the insulation resistor Rep and the insulation resistor Ren may form a circuit, and the isolation power module Y1 and the equivalent impedor Rx of the load appliance, that is, the isolation power module Y1 can supply power to the second sampling module F2, the insulation resistor Rep, the insulation resistor Ren and the load appliance.

Compared with the situation where the battery pack to be detected can supply power to the second sampling module F2, the insulation resistor Rep and the insulation resistor Ren and the load appliance only when the positive switching module K+ and the negative switching module K− are both turned on, the isolation power module Y1 can supply power to the second sampling module F2, the insulation resistor Rep and the insulation resistor Ren and the load appliance as a substitute for the battery pack to be detected, so that the insulation detection circuit can measure the insulation impedance value at the side where the load of the battery pack to be detected is located when both the positive switch module K+ and the negative switch module K− are not turned on.

In addition, according to the embodiment of the present application, the insulation resistance value Rep and the insulation resistance value Ren at the side where the load is located can be distinguished, so that whether there is a problem with the positive or negative electrode at the side where the load is located can be identified.

In some embodiments, a switch (not shown in the figure) may be added at the positive output terminal and the negative output terminal of the isolation power module Y1. The switch is turned off when it is not necessary to detect the insulation impedance at the side where the load is located, so as to avoid that the high voltage of the battery pack is introduced to the isolation power module Y1.

Figure 2:
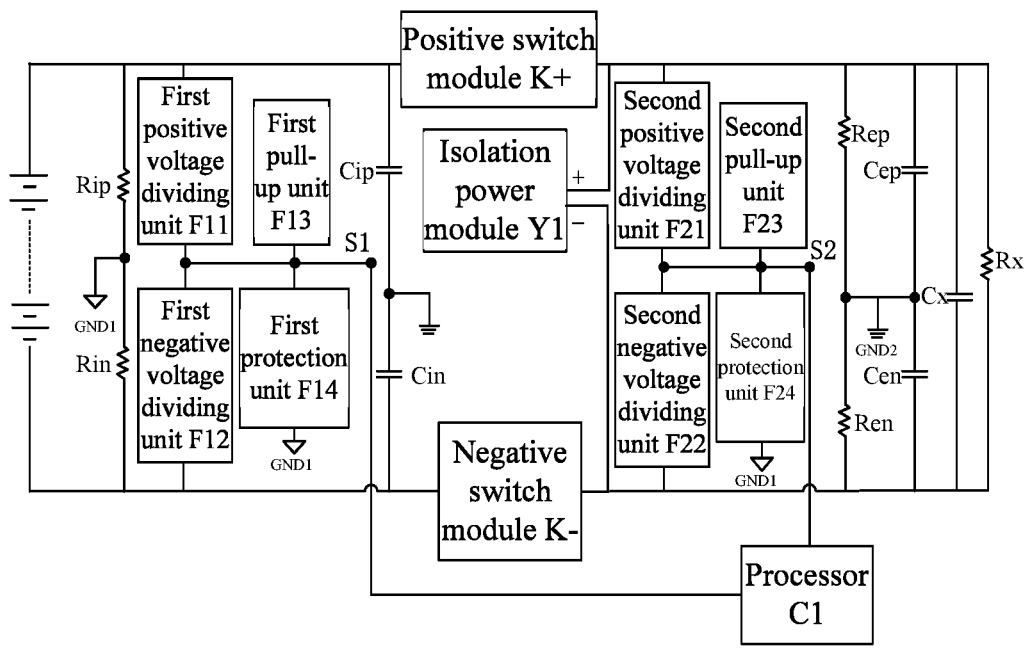
FIG. 2 is a structural diagram of an insulation detection circuit according to another embodiment of the present application.

FIG. 2 is a structural diagram of the insulation detection circuit according to another embodiment of the application. As shown in FIG. 2, the first sampling module F1 and the second sampling module F2 may include elements, and the specific structures of the first sampling module F1 and the second sampling module F2 will be illustrated as follows.

The first sampling module F1 includes a first positive voltage dividing unit F11, a first negative voltage dividing unit F12, a first pull-up unit F13, and a first protection unit F14, where a first terminal of the first positive voltage dividing unit F11 is connected to the positive electrode of the battery pack to be detected and the first terminal of the positive switch module K+ respectively, and a second terminal of the first positive voltage dividing unit F11 is connected to the first sampling point S1; a first terminal of the first negative voltage dividing unit F12 is connected to the first sampling point S1, a second terminal of the first negative voltage dividing unit F12 is connected to the negative electrode of the battery pack to be detected and the first terminal of the negative switch module K− respectively; the first pull-up unit F13 is connected to the first sampling point S1; and a first terminal of the first protection unit F14 is connected to the first sampling point S1, a second terminal of the first protection unit F14 is connected to the first reference voltage end GND1.

The second sampling module F2 includes a second positive voltage dividing unit F21, a second negative voltage dividing unit F22, a second pull-up unit F23, and a second protection unit F24, where a first terminal of the second positive voltage dividing unit F21 is connected to the second terminal of the positive switch module K+ and the positive electrode of the isolation power module Y1 respectively, and a second terminal of the second positive voltage dividing unit F21 is connected to the second sampling point S2; a first terminal of the second negative voltage dividing unit F22 is connected to the second sampling point S22, and a second terminal of the second negative voltage dividing unit F22 is connected to the second terminal of the negative switch module K− and the negative electrode of the isolation power module Y1 respectively; the second pull-up unit F23 is connected to the second sampling point S22; a first terminal of the second protection unit F24 is connected to the second sampling point S22, a second terminal of the second protection unit F24 is connected to the second reference voltage end GND2.

Figure 3:
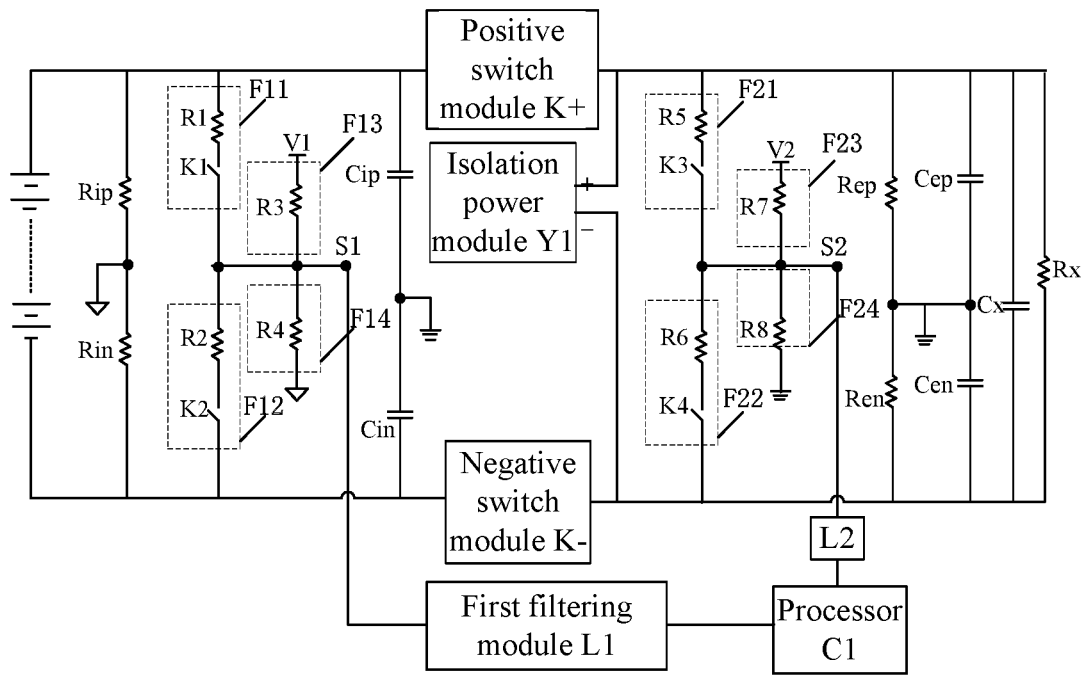
FIG. 3 is a structural diagram of an insulation detection circuit according to yet another embodiment of the present application.

FIG. 3 is a structural diagram of an insulation detection circuit according to another embodiment of the present application. As shown in FIG. 3, the first positive voltage dividing unit F11, the first negative voltage dividing unit F12, the first pull-up unit F13, the first protection unit F14, the second positive voltage dividing unit F21, the second negative voltage dividing unit F22, the second pull-up unit F23 and the second protection unit F24 may include elements, of which the examples below are for illustration.

The first positive voltage dividing unit F11 includes a first resistor network R1 and a first switch K1 connected in series; the first negative voltage dividing unit F12 includes a second resistor network R2 and a second switch K2 connected in series; the first pull-up unit F13 includes a first pull-up power V1 and a third resistor network R3, the third resistor network R3 is connected to the first sampling point S1; the first protection unit F14 includes a fourth resistor network R4.

The second positive voltage dividing unit F21 includes a fifth resistor network R5 and a third switch K3; the second negative voltage dividing unit F22 includes a sixth resistor network R6 and a fourth switch K4; the second pull-up unit F23 includes a second pull-up power V2 and a seventh resistor network R7 connected in series, and the seventh resistor network R7 is connected to the second sampling point S2; the second protection unit F24 includes an eighth resistor network R8.

The first resistor network R1, the second resistor network R2, the third resistor network R3 and the fourth resistor network R4 play the role of voltage division. The variation range of the internal resistance sampled signal of the first sampling point S1 can be adjusted by adjusting the resistance values of the first resistor network R1, the second resistor network R2, the third resistor network R3 and the fourth resistor network R4. For ease of calculation, for example, the resistor network integration forms and the resistance values of the first resistor network R1 and the second resistor network R2 may be the same, and the resistor network integration forms and the resistance values of the third resistor network R3 and the fourth resistor network R4 may be the same.

The fifth resistor network R5, the sixth resistor network R6, the seventh resistor network R7 and the eighth resistor network R8 also play the role of voltage division. The variation range of the external resistance sampled signal of the second sampling point S2 can be adjusted by adjusting the resistance values of the fifth resistor network R5, the sixth resistor network R6, the seventh resistor network R7 and the eighth resistor network R8. For ease of calculation, for example, the resistor network integration forms and the resistance values of the fifth resistor network R5 and the sixth resistor network R6 may be the same, and the resistor network integration forms and the resistance values of the seventh resistor network R7 and the eighth resistor network R8 may be the same.

The first switch K1 and the second switch K2 are used to cooperate to provide the first sampled signal. For example, when the first switch K1 is turned on and the second switch K2 is turned off, the first sampling point S1 may provide the first positive sampled signal, and when the first switch K1 is turned off and the second switch K2 is turned on, the first sampling point S1 may provide the first negative sampled signal.

The second sampled signal is provided through the cooperation of the third switch K3 and the fourth switch K4. When the third switch K3 is turned on and the fourth switch K4 is turned off, the second sampling point S2 may provide the second positive sampled signal. When the third switch K3 is turned off and the fourth switch K4 is turned on, the second sampling point S2 may provide the second negative sampled signal.

Figure 4:
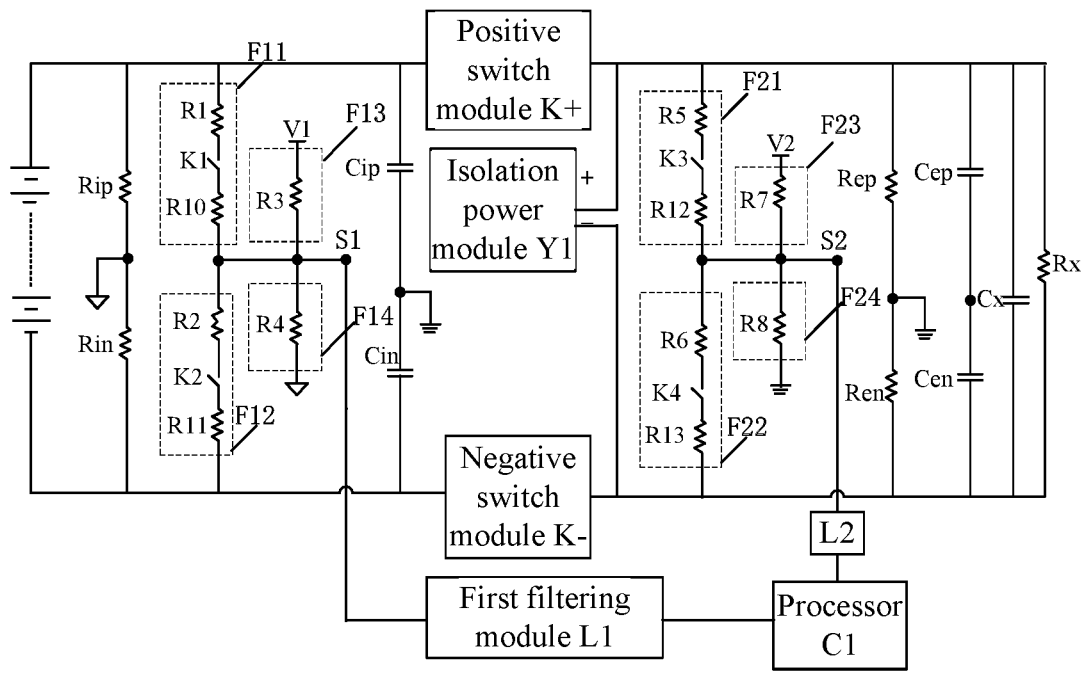
FIG. 4 is a structural diagram of an insulation detection circuit according to yet another embodiment of the present application.

FIG. 4 is a structural diagram of an insulation detection circuit according to another embodiment of the present application. The difference between FIG. 4 and FIG. 3 is that the first positive voltage dividing unit F11 in FIG. 4 further includes a tenth resistor network R10, which is connected in series to the first resistor network R10 and the first switch K1. The first negative voltage dividing unit R12 further includes an eleventh resistor network R11, where the eleventh resistor network R11, the second resistor network R2 and the second switch K2 are connected. The second positive voltage dividing unit F21 includes a twelfth resistor network R12, where the twelfth resistor network R12, the fifth resistor network R5 and the third switch K3 are connected in series. The second negative voltage dividing unit F22 includes a thirteenth resistor network R13, where the thirteenth resistor network R13, the sixth resistor network R6 and the fourth switch K4 are connected in series.

The positions of the first resistor network R13, the tenth resistor network R10 and the first switch device K1 may be interchanged with each other, the positions of the second resistor network R2, the eleventh resistor network R11 and the second switch device K2 may be interchanged with each other, the positions of the fifth resistor network R5, the twelfth resistor network R12 and the third switch device K3 may be interchanged with each other, the positions of the sixth resistor network R6, the thirteenth resistor network R13 and the fourth switch K4 may be exchanged with each other.

In some embodiments, whether to provide the first switch device K1, the second switch device K2, the third switch device K3 and the fourth switch device K4, as well as the turning on and off sequence of the respective switches may be determined according to the specific operation scenario and operation requirements. The switch includes elements that can implement the switching function, which will not be limited herein. For example, the switch may be a mechanical switch such as a single electrode, single throw switch, or an electronic switch such as a triode, a metal oxide semiconductor field effect crystal (MOS) transistor.

In addition, the first sampling point S1 and the second sampling point S2 as described above may both be connected to a sampling module for sampling. The sampling module may be an element that can realize the sampling function, such as an analog-to-digital converter (Analog-to-Digital Converter, ADC).

In an example, the insulation detection circuit further includes a first analog-to-digital conversion unit and a second analog-to-digital conversion unit (not shown in the drawings). The two ends of the first analog-to-digital conversion unit are respectively connected to the first sampling points S1 and the processor C1, and the first analog-to-digital conversion unit is configured to convert an analog signal collected at the first sampling point S1 into a digital signal; the two ends of the second analog-to-digital conversion unit are respectively connected to the second sampling point S2 and the processor C1, and the second analog-to-digital conversion unit is configured to convert an analog signal collected at the second sampling point S2 into a digital signal.

In some embodiments, the first sampling point S1 and the second sampling point S2 may also share one analog-to-digital conversion unit, which converts the analog signals collected at the first sampling point S1 and the second sampling point S2 into digital signals respectively.

FIG. 3 and FIG. 4 further illustrate a first filtering module L1 and a second filtering module L2, where a first terminal of the first filtering module L1 is connected to the first sampling point S1, a second terminal of the first filtering module L1 is connected to the processor C1, and the first filtering module L1 is configured to filter the first sampled signal; a second terminal of the second filtering module L2 is connected to the second sampling point S12, the second terminal of the second filtering module L2 is connected to the processor C1, and the second filtering module L2 is configured to filter the second sampled signal. Through the filtering unit, the interference part in the sampled signal can be filtered out and the sampling accuracy of the signal can be improved. The specific implementation form of the filter unit will not be limited here.

The following are examples for illustrating the specific structure of isolation power module Y1.

Figure 5:
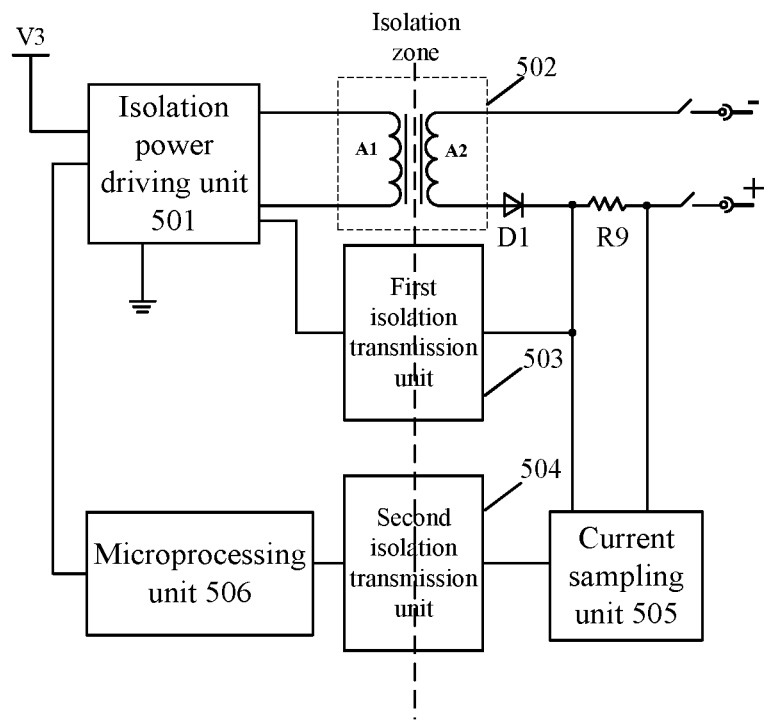
FIG. 5 is a structural diagram of a flyback isolation power module according to an embodiment of the present application.

FIG. 5 is a structural diagram of a flyback isolation power module according to an embodiment of the present application.

Figure 6:
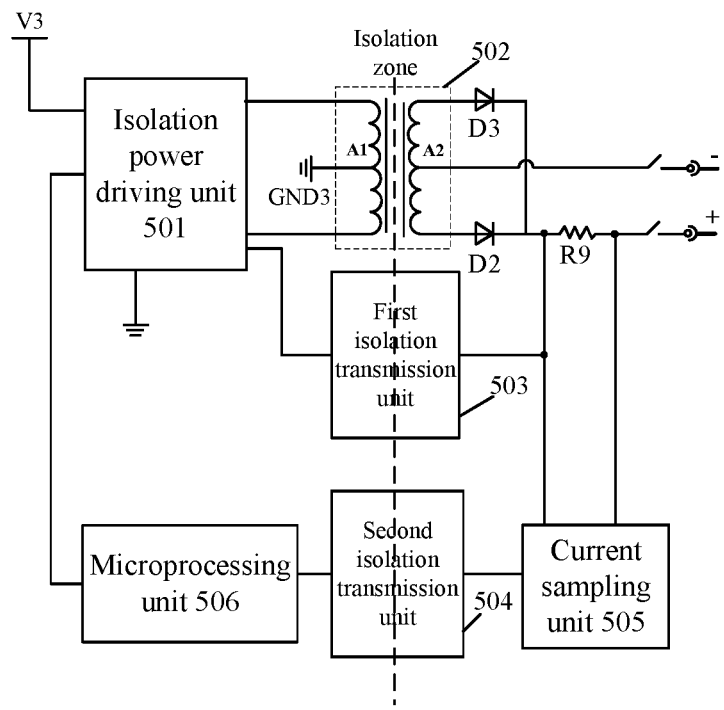
FIG. 6 is a structural diagram of a push-pull isolation power module according to an embodiment of the present application.

FIG. 6 is a structural diagram of a push-pull isolation power module according to an embodiment of the present application.

In an example, the isolation power module Y1 includes an isolation power driving unit 501 and a transformer 502 connected to each other. The isolation power driving unit 501 is powered by a direct current voltage source (for example, 12V) or a battery pack. After the output voltage of the direct current voltage source or the battery pack is processed by the isolation power driving unit 501 and transformer 502, for example, the voltage is raised from 12V to 60V, power is supplied to the positive and negative electrodes of the isolation power module Y1. It should be noted that the voltage, after being raised by the transformer 502, should not be too high so as not to affect the safety of the load appliance.

Referring to FIG. 5, a coil of the flyback isolation power module includes two terminals, which are a first terminals and a second terminals respectively. A first terminals of a coil A1 located on a first side of the transformer is connected to a first output terminal of the isolation power driving unit 501, a second terminals of the coil A1 located on the first side of the transformer is connected to a second output terminal of the isolation power driving unit 501; a first terminals of a coil A2 located on a second side of the transformer is configured to supply power to the positive electrode of the isolation power module Y1, and a second terminal of the coil A2 located on the second side of the transformer is configured to supply power to the negative electrode of the isolation power module Y1.

Referring to FIG. 6, a coil of the push-pull isolation power module includes three terminals, which are a first terminal and a second terminal and a third terminal respectively. A first terminal of a coil A1 located on a first side of the transformer is connected to a first output terminal of the isolation power driving unit 501, a second terminal of the coil A1 located on the first side of the transformer is connected to a third reference voltage end GND3, and a third terminal of the coil located on the first side of the transformer is connected to a second output terminal of the isolation power driving unit 501; a first terminal of the coil A2 located on a second side of the transformer is configured to supply power to the positive electrode of the isolation power module Y1, a second terminal of the coil A2 located on the second side of the transformer is configured to supply power to the negative electrode of the isolation power module Y1, and a third terminal of the coil A2 located on the second side of the transformer is configured to connect to the first terminal of the coil A2 located on the second side of the transformer.

In some embodiments, referring to FIG. 5 and FIG. 6, the isolation power module further includes a ninth resistor network R9, where the ninth resistor network R9 is located on a line between the coil A2 located on the second side of the transformer and the positive electrode or the negative electrode of the isolation power module Y1, and is used for state detection of the charging circuit of the isolation power module Y1.

In the example of FIG. 5, the ninth resistor network R9 is located on the line between coil A2 located on the second side of the transformer and the positive electrode of the isolation power module Y1. A diode D1 is used for implementing rectification. The diode D1 is connected to the first terminal of the coil A2 located on the second side of transformer 502. For example, the diode D1 may also be connected to the second terminal of coil A2 located on the second side of transformer 502.

In the example of FIG. 6, the ninth resistor network R9 is located on the line between the coil A2 located on the second side of the transformer and the positive electrode of the isolation power module Y1. A diode D2 and a diode D3 are used for implementing rectification. The diode D2 is connected to the first terminal of the coil A2 located on the second side of transformer 502, and the diode D3 is connected to the second terminal of the coil A2 on the second side of transformer 502.

In some embodiments, referring to FIG. 5 and FIG. 6, the isolation power module Y1 further includes a first isolation transmission unit 503, where a first terminal of the first isolation transmission unit 503 is connected to a first terminal or a second terminal of the ninth resistor network R9, and a second terminal of the first isolation transmission unit 503 is connected to a first input terminal of the isolation power driving unit 501.

The first isolation transmission unit 503 may be an isolation circuit that can realize analog quantity transmission. For example, it includes an isolation switch and a sampling circuit. The sampling circuit is configured to collect a voltage feedback signal from the first terminal or second terminal of the ninth resistor network R9. The isolation switch may be an isolation optocoupler device, etc. After the isolation switch is turned on, the voltage feedback signal may be safely transmitted to the isolation power driving unit 501, which adjusts a charging current of the isolation power supply module Y1 according to the voltage feedback signal, in order to keep it stable.

In some embodiments, referring to FIG. 5 and FIG. 6, the isolation power module Y1 further includes a current sampling unit 505, a second isolation transmission unit 504 and a microprocessing unit 506 electrically connected in sequence; the current sampling unit 505 is connected to the first terminal and the second terminal of the ninth resistor network R9 respectively, and the microprocessing unit 506 is further connected to the second input terminal of the isolation power driving unit 501.

The current sampling unit 505 may be a differential sampling circuit, and the second isolation transmission unit 504 may be an isolation circuit that can realize digital quantity transmission. The differential sampling circuit is configured to collect the voltage feedback signals from the first terminal and the second terminal of the ninth resistor network R9, obtain a charging circuit current through calculation, and then transmit the charging circuit current to the microprocessing unit 506 safely through a digital quantity isolation circuit; or, directly transmit the voltages at the first terminal and the second terminal of the ninth resistor network R9 to the microprocessing unit 506, and then the charging circuit current is calculated by the microprocessing unit 506. The microprocessing unit 506 can make a determination according to charging current values at different times when the side where the load is located is charged by the isolation power module Y1, where whether there is a short circuit in the load electric circuit is determined, so that the safety problem caused by the short circuit in the load electric circuit is avoided.

FIG. 5 and FIG. 6 are only schematic illustrations of a flyback step-up isolation power module and a push-pull isolation power module. A flyback step-down power module and other types of power module that can realize isolation transmission are within the protection scope of the present application.

FIG. 7 is a schematic flowchart of a detection method of an insulation detection circuit according to an embodiment of the present application. As shown in FIG. 7, the detection method includes step 701 and step 702.

Step 701: obtaining a first sampled signal from the first sampling point S1, and obtaining, according to the first sampled signal, an insulation resistance value Rip of a positive high voltage circuit at a side of where the battery pack to be detected is located relative to the first reference voltage end GND1 and an insulation resistance value Rin of a negative high voltage circuit at the side where the battery pack to be detected is located relative to the first reference voltage end GND1. The first sampled signal needs to be collected with cooperation of the turning on and off of the first switch K1 and the second switch K2.

Step 702: obtaining a second sampled signal from the second sampling point S2, and obtaining, according to the second sampled signal, an insulation resistance value Rep of a positive high voltage circuit at a side where the load is located relative to the second reference voltage end GND2 and an insulation resistance value Ren of a negative high voltage circuit at the side where the load is located relative to the second reference voltage end GND2. The second sampled signal needs to be collected in cooperation with the closing and opening of the third switch K3 and the fourth switch K4.

Figure 8:
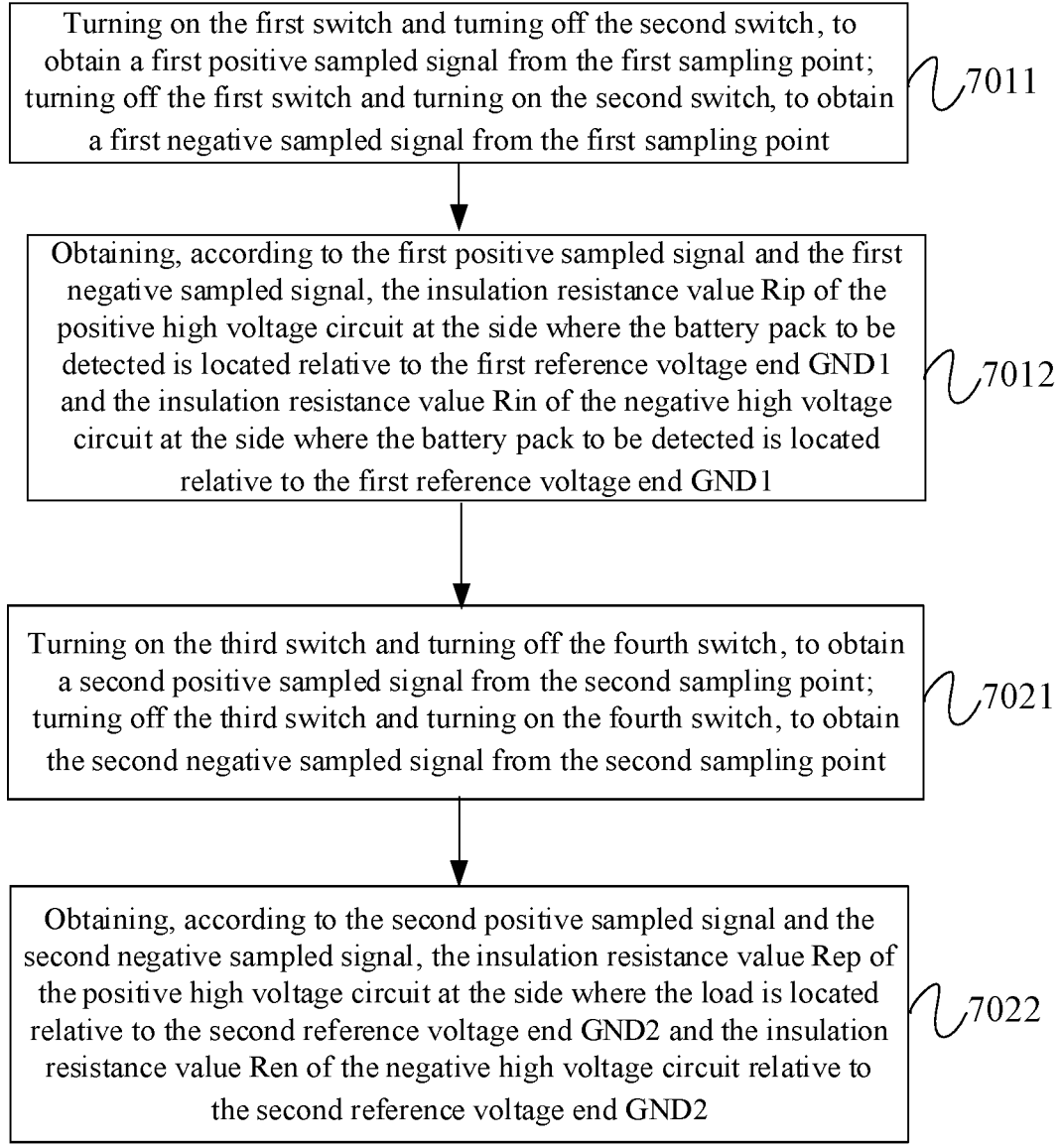
FIG. 8 is a schematic flowchart of a detection method of an insulation detection circuit according to another embodiment of the present application.

FIG. 8 is a schematic flowchart of a detection method of an insulation detection circuit according to another embodiment of the present application. The difference between FIG. 8 and FIG. 7 is that step 701 in FIG. 7 may be divided into step 7011 and step 7012 in FIG. 8, and step 702 in FIG. 7 may be divided into step 7021 and step 7022 in FIG. 8.

Step 7011: turning on the first switch K1 and turning off the second switch K2, to obtain a first positive sampled signal from the first sampling point S1; turning off the first switch K1 and turning on the second switch K2, to obtain a first negative sampled signal from the first sampling point S1.

Step 7012: obtaining, according to the first positive sampled signal and the first negative sampled signal, the insulation resistance value Rip of the positive high voltage circuit at the side where the battery pack to be detected is located relative to the first reference voltage end GND1 and the insulation resistance value Rin of the negative high voltage circuit at the side where the battery pack to be detected is located relative to the first reference voltage end GND1.

Step 7021: turning on the third switch K3 and turning off the fourth switch K4, to obtain a second positive sampled signal from the second sampling point S2; turning off the third switch K3 and turning on the fourth switch K4, to obtain the second negative sampled signal from the second sampling point S2.

Step 7022: obtaining, according to the second positive sampled signal and the second negative sampled signal, the insulation resistance value Rep of the positive high voltage circuit at the side where the load is located relative to the second reference voltage end GND2 and the insulation resistance value Ren of the negative high voltage circuit relative to the second reference voltage end GND2.

FIG. 1 to FIG. 4 further schematically show the positions of the insulation resistor Rip and the insulation resistor Rin at the side where the battery pack is located in the circuit diagram, and the positions of the insulation resistor Rep and the insulation resistance Ren at the side where the load is located in the circuit diagram.

Based on Kirchhoff's law, the calculation process of the insulation resistance values Rip and Rin at the side where the battery pack is located is described in detail.

First, the first positive sampled voltage Vs1 is substituted into the first equation group, where the expression of the first equation group is:

$$\begin{cases} Vp1 = R3 \times \left(\dfrac{Vs1}{R1} + \dfrac{Vs1}{R3} - \dfrac{V1-Vs1}{R2}\right) \\ Vn1 = Ubat - Vp1 = Ubat - R3 \times \left(\dfrac{Vs1}{R1} + \dfrac{Vs1}{R3} - \dfrac{V1-Vs1}{R2}\right) \\ Rip = \dfrac{Vp1}{\dfrac{Vn1}{Rin} - \dfrac{Vs1}{R2} + \dfrac{V1-Vs1}{R1}} \\ Rin = \dfrac{Vn1}{\dfrac{Vs1}{R2} + \dfrac{Vp1}{Rp} - \dfrac{V1-Vs1}{R1}} \end{cases} \quad (1)$$

Then, the first negative sampled voltage Vs2 is substituted into the second equation group, the expression of the first equation group is:

$$\begin{cases} Vn2 = -R4 \times \left(\dfrac{Vs2}{R1} + \dfrac{Vs2}{R4} - \dfrac{V1-Vs2}{R2}\right) \\ Vp2 = Ubat - Vn2 = Ubat - R4 \times \left(\dfrac{Vs2}{R1} + \dfrac{Vs2}{R4} - \dfrac{V1-Vs2}{R2}\right) \\ Rip = \dfrac{Vp2}{\dfrac{Vn2}{Rin} - \dfrac{Vs2}{R2} + \dfrac{V1-Vs2}{R1}} \\ Rin = \dfrac{Vn2}{\dfrac{Vs2}{R2} + \dfrac{Vp2}{Rp} - \dfrac{V1-Vs2}{R1}} \end{cases} \quad (2)$$

In the above formulas (1) and (2), R1 is the resistance value of the first resistor network R1, R2 is the resistance value of the second resistor network R2, R3 is the resistance value of the third resistor network R3, and R4 is the resistance value of the fourth resistor network R4, Vs1 is the first positive sampled voltage (corresponding to the first positive sampled signal) when the first switch K1 is turned on and the second switch K2 is turned off, Vs2 is the first negative sampled voltage (corresponding to the first negative sampled signal) when the first switch K1 is turned off and the second switch K2 is turned on, V1 is the first pull-up voltage, Vp1 is the voltage across the two terminals of Rip when the first switch K1 is turn on and the second switch K2 is turned off, Vn1 is the voltage across the two terminals of Rin when the first switch K1 is turned on and the second switch K2 is turned off, Vp2 is the voltage across the two terminals of Rip when the first switch K1 is turned off and the second switch K2 is turned on, Vn2 is the voltage across the two terminals of Rin when the first switch K1 is turned off and the second switch K2 is turned on, and Ubat is the total voltage of the battery pack to be detected.

By combining the first and second equation groups, the positive insulation resistance value Rip and the negative insulation resistance value Rep at the side where the battery pack is located can be obtained as:

$$\begin{cases} Rip = \dfrac{Ubat \times (R2 \times Ubat - R2 \times Vs1 + R2 \times Vs2 - 2 \times R4 \times Vs1 + 2 \times R4 \times Vs2)}{Ubat \times V0 - 2 \times Ubat \times Vs2 - V1 \times Vs1 + V1 \times Vs2} \\ Rin = -\dfrac{Ubat \times (R2 \times Ubat - R2 \times Vs1 + R2 \times Vs2 - 2 \times R4 \times Vs1 + 2 \times R4 \times Vs2)}{Ubat \times V1 - 2 \times Ubat \times Vs1 - V1 \times Vs1 + V1 \times Vs2} \end{cases} \quad (3)$$

Similarly, the second positive sampled voltage Vs3 and the second negative sampled voltage Vs4 are substituted into the corresponding equation groups, and the positive insulation resistance value Rep and the negative insulation resistance value Rep at the side where the load is located can be obtained as:

$$\begin{cases} Rep = \dfrac{Uiso \times (R6 \times Uiso - R6 \times Vs3 + R6 \times Vs4 - 2 \times R8 \times Vs3 + 2 \times R8 \times Vs4)}{Uiso \times V2 - 2 \times Uiso \times Vs4 - V2 \times Vs3 + V2 \times Vs4} \\ Ren = -\dfrac{Uiso \times (R8 \times Uiso - R8 \times Vs3 + R8 \times Vs4 - 2 \times R8 \times Vs3 + 2 \times R8 \times Vs8)}{Uiso \times V2 - 2 \times Uiso \times Vs3 - V2 \times Vs3 + V2 \times Vs4} \end{cases} \quad (4)$$

In the above formula (4), R6 is the resistance value of the sixth resistor network R6, R8 is the resistance of the eighth resistor network R8, Vs3 is the second positive sampled voltage (corresponding to the second positive sampled signal) when the third switch K3 is turned on and the fourth switch K4 is turned off, Vs4 is the second negative sampled voltage (corresponding to the second negative sampled signal) when the third switch K3 is turned off and the fourth switch K4 is turned on, V2 is the second pull-up voltage, and Uios is the total output of the insulation power module Y1.

According to the embodiment of the present application, the insulation resistance values Rip and Rin at the side where the battery pack to be tested is located are respectively compared with the corresponding preset standard thresholds, so that whether the insulation resistance values between the positive electrode and the negative electrode at the side where the battery pack is located with the battery casing meet the standard are monitored in real time, thus the safety problems caused by the insulation resistance values between the positive electrode and negative electrode at the side where the battery pack is located with the battery shell do not meet the standard are avoided.

In the same way, the insulation resistance values Rep and Ren at the side where the load is located are compared with the their corresponding preset standard thresholds, so that whether the insulation resistance values between the positive electrode and the negative electrode at the side where the load is located with the vehicle body meet the standard can be monitored in real time, thus the safety problems caused by the insulation resistance values between the positive electrode and the negative electrode at the side where the load is located with the vehicle body do not meet the standard are avoided.

Figure 9:
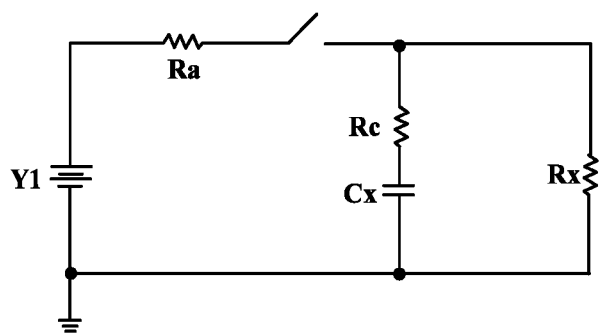
FIG. 9 is a charging analog circuit of an isolation power module according to an embodiment of the present application.

FIG. 9 is a charging analog circuit of the isolation power module according to an embodiment of the application. Y1 is the isolation power, Ra is the equivalent line impedor, Rx is the equivalent load impedor, Cx is the X capacitor, and Rc is the equivalent impedor of the X capacitor.

In an example, given that the output voltage of the isolation power Y1 is 60V, the equivalent line impedance Ra is 1Ω, the equivalent load impedance Rx is 1 KΩ, and the equivalent impedance Rc is 1Ω. By simulating the charging simulation circuit in FIG. 9, a charging current simulation curve in FIG. 10 can be obtained.

Figure 10:
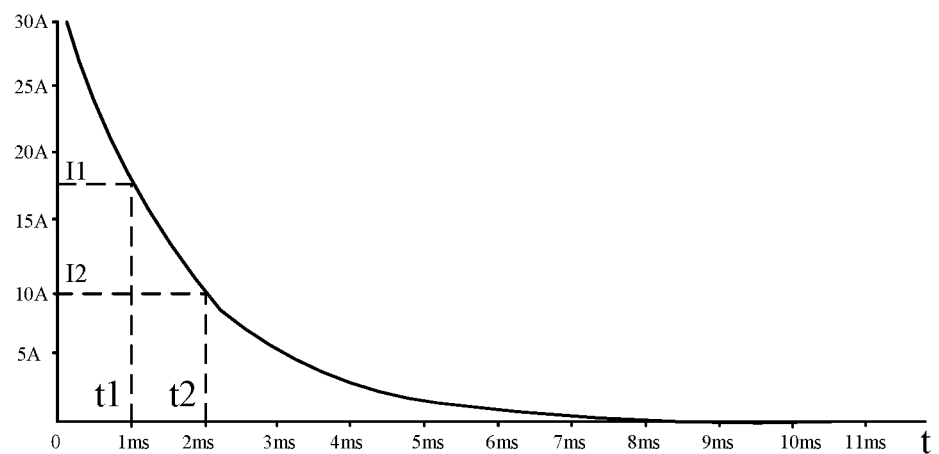
FIG. 10 is a simulation curve of a charging current corresponding to FIG. 9.

It can be seen from FIG. 10 that, due to the existence of Cx capacitor, the charging current of isolation power module Y1 is relatively high at the beginning of its operation, and with the extension of the time of charging, the charging current gradually decreases, and finally tends to be stable. In the decreasing process, the declining rate in the earlier stage is greater than the declining rate in the later stage.

Based on this, in order to avoid the safety problems caused by the short circuit of the load electric circuit, the charging current value of the isolation power module Y1 during the charging at the side where the load is located can be determined, and whether there is a short circuit in the load electric circuit is determined. In an example, current values at two different moments may be detected and compared, to determine whether there is a short circuit in the load electric circuit according to the comparison result.

For example, at a first predetermined moment, a first set of voltage signals can be collected from the first terminal and the second terminal of the ninth resistor network R9 (see FIG. 6 or FIG. 7), and based on the first set of voltage signals, the charging current of the isolation power module at the first predetermined moment can be obtained; at a second predetermined moment, a second set of voltage signals can be collected from the second terminal and the second terminal of the ninth resistor network R9, and based on the second set of voltage signals, the charging current of the isolation power module at the second predetermined moment is obtained, where the first predetermined moment is earlier than the second predetermined moment. Then, the charging current at the first predetermined moment is compared with the charging current at the second predetermined moment, and according to the comparison result, it is determined whether the load electric circuit of the battery pack to be detected is short circuited. If the load electric circuit is short circuited, a non-enable signal is transmitted to the isolation power driving unit 501, an external load short circuit fault is reported at the same time, and then turning on the positive switch module K+ and negative switch module K− will not be allowed.

Take FIG. 10 as an example, given that the current value detected at moment t1 is I1, and after a period of time, the current value detected at moment t2 is I2. If I1>I2, it means that the load impedance at the side where the load side is located is substantially normal, and the next step of insulation detection can be carried out. If I1<I2, it means that the load electric circuit is short circuited, and it is necessary to directly report the abnormal fault of the impedance at the side where the load is located, and timely transmit the non-enable signal to the isolation power driving unit 501 to avoid the risk of high-voltage direct short circuit caused by abnormal situation of the load although the insulation resistance relative to the low-voltage ground is normal. Those skilled in the art may select specific values of t1 and t2 according to the actual situation, which will not be limited herein.

The embodiments of the application also provide a battery management system, which includes the insulation detection circuit as described above.

Although the present application has been described with reference to the preferred embodiments, various modifications may be made thereto and components thereof may be replaced with equivalents without departing from the scope of the present application. In particular, as long as there is no structural conflict, the technical features mentioned in the embodiments can be combined in any manner. The present application is not limited to the specific embodiments disclosed herein, instead, it includes all technical solutions that fall within the scope of the claims.

What is claimed is:

1. An insulation detection circuit, comprising: an isolation power module, a first sampling module, a first sampling point, a second sampling module, a second sampling point and a processor, wherein, a first terminal of the first sampling module is connected to a positive electrode of a battery pack to be detected and a first terminal of a positive switch module respectively, a second terminal of the first sampling module is connected to a negative electrode of the battery pack to be detected and a first terminal of a negative switch module respectively, a third terminal of the first sampling module is connected to a first reference voltage end, and the first sampling module is configured to provide a first sampled signal for the first sampling point;

a first terminal of the second sampling module is connected to a second terminal of the positive switch module and a positive electrode of the isolation power module respectively, a second terminal of the second sampling module is connected to a second terminal of the negative switch module and a negative electrode of the isolation power module respectively, a third terminal of the second sampling module is connected to a second reference voltage end, and the second sampling module is configured to provide a second sampled signal for the second sampling point; and the processor is connected to the first sampling point and the second sampling point respectively, the processor is configured to obtain, according to the first sampled signal, an insulation resistance value of a positive high voltage circuit at a side where the battery pack to be detected is located relative to the first reference voltage end and an insulation resistance value of a negative high voltage circuit at the side where the battery pack to be detected is located relative to the first reference voltage end, and obtain, according to the second sampled signal, an insulation resistance value of a positive high voltage circuit at a side where a load is located relative to the second reference voltage end and an insulation resistance value of a negative high voltage circuit at the side where the load is located relative to the second reference voltage end, wherein, the isolation power module comprises an insulation power driving unit and a transformer connected to each other;

the isolation power driving unit is powered by a direct current voltage source or a battery pack; and the isolation power driving unit and the transformer are configured to process an output voltage of the direct current voltage source or the battery pack to supply power to the positive electrode and the negative electrode of the isolation power module.

2. The circuit according to claim 1, wherein, the first sampling module comprises a first positive voltage dividing unit, a first negative voltage dividing unit, a first pull-up unit, and a first protection unit, wherein, a first terminal of the first positive voltage dividing unit is connected to the positive electrode of the battery pack to be detected and the first terminal of the positive switch module respectively, and a second terminal of the first positive voltage dividing unit is connected to the first sampling point;

a first terminal of the first negative voltage dividing unit is connected to the first sampling point, a second terminal of the first negative voltage dividing unit is connected to the negative electrode of the battery pack to be detected and the first terminal of the negative switch module respectively;

the first pull-up unit is connected to the first sampling point;

a first terminal of the first protection unit is connected to the first sampling point, and a second terminal of the first protection unit is connected to the first reference voltage end.

3. The circuit according to claim 2, wherein, the first positive voltage dividing unit comprises a first resistor network and a first switch connected in series;

the first negative voltage dividing unit comprises a second resistor network and a second switch connected in series;

the first pull-up unit comprises a first pull-up power and a third resistor network connected in series, wherein, the third resistor network is connected to the first sampling point;

the first protection unit comprises a fourth resistor network.

4. The circuit according to claim 3, wherein, the first positive voltage dividing unit further comprises a tenth resistor network, wherein, the tenth resistor network, the first resistor network and the first switch are connected in series;

the first negative voltage dividing unit further comprises an eleventh resistor network, wherein, the eleventh resistor network, the second resistor network and the second switch are connected in series.

5. The circuit according to claim 1, wherein, the second sampling module comprises a second positive voltage dividing unit, a second negative voltage dividing unit, a second pull-up unit, and a second protection unit, wherein, a first terminal of the second positive voltage dividing unit is connected to the second of the positive switch module and the positive electrode of the isolation power module respectively, and a second terminal of the second positive voltage dividing unit is connected to the second sampling point;

a first terminal of the second negative voltage dividing unit is connected to the second sampling point, and a second terminal of the second negative voltage dividing unit is connected to the second terminal of the negative switch module and the negative electrode of the isolation power module respectively;

the second pull-up unit is connected to the second sampling point;

a first terminal of the second protection unit is connected to the second sampling point, a second terminal of the second protection unit is connected to the second reference voltage end.

6. The circuit according to claim 5, wherein, the second positive voltage dividing unit comprises a fifth resistor network and a third switch connected in series;

the second negative voltage dividing unit comprises a sixth resistor network and a fourth switch connected in series;

the second pull-up unit comprises a second pull-up power and a seventh resistor network connected in series, wherein, the seventh resistor network is connected to the second sampling point;

the second protection unit comprises an eighth resistor network.

7. The circuit according to claim 6, wherein, the second positive voltage dividing unit comprises a twelfth resistor network, wherein, the twelfth resistor network, the fifth resistor network and the third switch are connected in series;

the second negative voltage dividing unit comprises a thirteenth resistor network, wherein, the thirteenth resistor network, the sixth resistor network and the fourth switch are connected in series.

8. The circuit according to claim 1, wherein, the insulation detection circuit further comprises: a first analog-to-digital conversion unit and a second analog-to-digital conversion unit, wherein, two terminals of the first analog-to-digital conversion unit are connected to the first sampling point and the processor respectively, two terminals of the second analog-to-digital conversion unit are connected to the second sampling point and the processor respectively.

9. The circuit according to claim 1, wherein, the insulation detection circuit further comprises a first filtering module and a second filtering module, wherein, a first terminal of the first filtering module is connected to the first sampling point, a second terminal of the first filtering module is connected to the processor, and the first filtering module is configured to filter the first sampled signal;

a first terminal of the second filtering module is connected to the second sampling point, and a second terminal of the second filtering module is connected to the processor, and the second filtering module is configured to filter the second sampled signal.

10. The circuit according to claim 1, wherein, a coil of the transformer comprises two terminals, which are a first terminal and a second terminal respectively, wherein:
- a first terminal of a coil located on a first side of the transformer is connected to a first output terminal of the isolation power driving unit, a second terminal of the coil located on the first side of the transformer is connected to a second output terminal of the isolation power driving unit;
- a first terminal of a coil located on a second side of the transformer is configured to supply power to the positive electrode of the isolation power module, and a second terminal of the coil located on the second side of the transformer is configured to supply power to the negative electrode of the isolation power module.

11. The circuit according to claim 10, wherein, the isolation power module further comprises a ninth resistor network, wherein, the ninth resistor network is located on a line between the coil on the second side of the transformer and the positive electrode or the negative electrode of the isolation power module.

12. The circuit according to claim 11, wherein, the isolation power module further comprises a first isolation transmission unit;
- a first terminal of the first isolation transmission unit is connected to a first terminal or a second terminal of the ninth resistor network, and a second terminal of the first isolation transmission unit is connected to a first input terminal of the isolation power driving unit.

13. The circuit according to claim 11, wherein, the isolation power module comprises a current sampling unit, a second isolation transmission unit and a microprocessing unit electrically connected in sequence;
- the current sampling unit comprises a first sampling terminal and a second sampling terminal, wherein, the first sampling terminal is connected to a first terminal of the ninth resistor network, the second sampling terminal is connected to a second terminal of the ninth resistor network, and the microprocessing unit is further connected to a second input terminal of the isolation power driving unit.

14. The circuit according to claim 1, wherein, a coil of the transformer comprises three terminals, which are a first terminal and a second terminal and a third terminal respectively, wherein:
- a first terminal of a coil located on a first side of the transformer is connected to a first output terminal of the isolation power driving unit, a second terminal of the coil located on the first side of the transformer is connected to a third reference voltage end, and a third terminal of the coil located on the first side of the transformer is connected to a second output terminal of the isolation power driving unit;
- a first terminal of a coil located on a second side of the transformer is configured to supply power to the positive electrode of the isolation power module, a second terminal of the coil located on the second side of the transformer is configured to supply power to the negative electrode of the isolation power module, and a third terminal of the coil located on the second side of the transformer is configured to connect to the first terminal of the coil located on the second side of the transformer.

15. A battery management system, comprising the insulation detection circuit according to claim 1.

16. A detection method of an insulation detection circuit, which is applied to the insulation detection circuit according to claim 1, wherein, the method comprises:

obtaining a first sampled signal from the first sampling point, and obtaining, according to the first sampled signal, an insulation resistance value of a positive high voltage circuit at a side where the battery pack to be detected is located relative to the first reference voltage end and an insulation resistance value of a negative high voltage circuit at the side where the battery pack to be detected is located relative to the first reference voltage end; and obtaining a second sampled signal from the second sampling point, and obtaining, according to the second sampled signal, an insulation resistance value of a positive high voltage circuit at a side where a load is located relative to the second reference voltage end and an insulation resistance value of a negative high voltage circuit at the side where the load is located relative to the second reference voltage end.

17. The method according to claim 16, wherein, the first sampling module comprises a first positive voltage dividing unit, a first negative voltage dividing unit, a first pull-up unit, and a first protection unit, wherein, a first terminal of the first positive voltage dividing unit is connected to the positive electrode of the battery pack to be detected and the first terminal of the positive switch module respectively, and a second terminal of the first positive voltage dividing unit is connected to the first sampling point; a first terminal of the first negative voltage dividing unit is connected to the first sampling point, a second terminal of the first negative voltage dividing unit is connected to the negative electrode of the battery pack to be detected and the first terminal of the negative switch module respectively; the first pull-up unit is connected to the first sampling point; a first terminal of the first protection unit is connected to the first sampling point, and a second terminal of the first protection unit is connected to the first reference voltage end;

the first positive voltage dividing unit comprises a first resistor network and a first switch connected in series; the first negative voltage dividing unit comprises a second resistor network and a second switch connected in series; the first pull-up unit comprises a first pull-up power and a third resistor network connected in series, wherein, the third resistor network is connected to the first sampling point; the first protection unit comprises a fourth resistor network; and the obtaining a first sampled signal from the first sampling point, and obtaining, according to the first sampled signal, an insulation resistance value of a positive high voltage circuit at a side where the battery pack to be detected is located relative to the first reference voltage end and an insulation resistance value of a negative high voltage circuit at the side where the battery pack to be detected is located relative to the first reference voltage end comprises:

turning on the first switch, and turning off the second switch, to obtain a first positive sampled signal from the first sampling point;

turning off the first switch, and turning on the second switch, to obtain a first negative sampled signal from the first sampling point;

obtaining, according to the first positive sampled signal and the first negative sampled signal, the insulation resistance value of the positive high voltage circuit at the side where the battery pack to be detected is located relative to the first reference voltage end and the insulation resistance value of the negative high voltage circuit at the side where the battery pack to be detected is located relative to the first reference voltage end.

18. The method according to claim 16, wherein,
the second sampling module comprises a second positive voltage dividing unit, a second negative voltage dividing unit, a second pull-up unit, and a second protection unit, wherein, a first terminal of the second positive voltage dividing unit is connected to the second of the positive switch module and the positive electrode of the isolation power module respectively, and a second terminal of the second positive voltage dividing unit is connected to the second sampling point; a first terminal of the second negative voltage dividing unit is connected to the second sampling point, and a second terminal of the second negative voltage dividing unit is connected to the second terminal of the negative switch module and the negative electrode of the isolation power module respectively; the second pull-up unit is connected to the second sampling point; a first terminal of the second protection unit is connected to the second sampling point, a second terminal of the second protection unit is connected to the second reference voltage end;
the second positive voltage dividing unit comprises a fifth resistor network and a third switch connected in series; the second negative voltage dividing unit comprises a sixth resistor network and a fourth switch connected in series; the second pull-up unit comprises a second pull-up power and a seventh resistor network connected in series, wherein, the seventh resistor network is connected to the second sampling point; the second protection unit comprises an eighth resistor network; and
the obtaining a second sampled signal from the second sampling point, and obtaining, according to the second sampled signal, an insulation resistance value of a positive high voltage circuit at a side where a load is located relative to the second reference voltage end and an insulation resistance value of a negative high voltage circuit at the side where the load is located relative to the second reference voltage end comprises:
turning on the third switch, and turning off the fourth switch, to obtain a second positive sampled signal from the second sampling point;
turning off the third switch, and turning on the fourth switch, to obtain a second negative sampled signal from the second sampling point;
obtaining, according to the second positive sampled signal and the second negative sampled signal, the insulation resistance value of the positive high voltage circuit at the side where the load is located relative to the second reference voltage end and the insulation resistance value of the negative high voltage circuit at the side where the load is located relative to the second reference voltage end.

19. The method according to claim 16, wherein,
the isolation power module comprises an insulation power driving unit and a transformer connected to each other; the isolation power driving unit is powered by a direct current voltage source or a battery pack; and the isolation power driving unit and the transformer are configured to process an output voltage of the direct current voltage source or the battery pack to supply power to the positive electrode and the negative electrode of the isolation power module;
a coil of the transformer comprises two terminals, which are a first terminal and a second terminal respectively, wherein: a first terminal of a coil located on a first side of the transformer is connected to a first output terminal of the isolation power driving unit, a second terminal of the coil located on the first side of the transformer is connected to a second output terminal of the isolation power driving unit; a first terminal of a coil located on a second side of the transformer is configured to supply power to the positive electrode of the isolation power module, and a second terminal of the coil located on the second side of the transformer is configured to supply power to the negative electrode of the isolation power module;
the isolation power module further comprises a ninth resistor network, wherein, the ninth resistor network is located on a line between the coil on the second side of the transformer and the positive electrode or the negative electrode of the isolation power module; and
the method further comprises:
at a first predetermined moment, collecting a first set of voltage signals from the first terminal and the second terminal of the ninth resistor network, and obtaining, based on the first set of voltage signals, a charging current of the isolation power module at the first predetermined moment;
at a second predetermined moment, collecting a second set of voltage signals from the first terminal and the second terminal of the ninth resistor network, and obtaining, based on the second set of voltage signals, a charging current of the isolation power module at the second predetermined moment, wherein, the first predetermined moment is earlier than the second predetermined moment;
comparing the charging current at the first predetermined moment and the charging current at the second predetermined moment;
determining, according to a result of the comparing, whether a load electric circuit of the battery pack to be detected is short circuited;
if the load electric circuit fails, turning off the isolation power driving unit, disabling the positive switch module and the negative switch module, and reporting information indicating that the load electric circuit fails to a higher-level controller.

\* \* \* \* \*